(12) United States Patent
Takahashi et al.

(10) Patent No.: US 10,155,362 B2
(45) Date of Patent: Dec. 18, 2018

(54) FLUORORESIN TUBE

(71) Applicant: JUNKOSHA INC., Kasama-shi, Ibaraki (JP)

(72) Inventors: Koji Takahashi, Kasama (JP); Yuushi Okeda, Kasama (JP)

(73) Assignee: JUNKOSHA INC., Kasama-shi (JP)

( * ) Notice: Subject to any disclaimer, the term of this patent is extended or adjusted under 35 U.S.C. 154(b) by 0 days.

(21) Appl. No.: 15/501,325

(22) PCT Filed: Jul. 31, 2015

(86) PCT No.: PCT/JP2015/071871
§ 371 (c)(1),
(2) Date: Feb. 2, 2017

(87) PCT Pub. No.: WO2016/021518
PCT Pub. Date: Feb. 11, 2016

(65) Prior Publication Data
US 2017/0225436 A1    Aug. 10, 2017

(30) Foreign Application Priority Data

Aug. 5, 2014 (JP) ................... 2014-159725
Nov. 5, 2014 (JP) ................... 2014-225657

(51) Int. Cl.
*A61B 1/31* (2006.01)
*B32B 25/08* (2006.01)
(Continued)

(52) U.S. Cl.
CPC ............... *B32B 25/08* (2013.01); *B32B 1/08* (2013.01); *B32B 25/20* (2013.01); *C08J 7/12* (2013.01);
(Continued)

(58) Field of Classification Search
CPC ..... C23C 16/045; C23C 16/513; B32B 25/08; B32B 1/08; B32B 25/20
(Continued)

(56) References Cited

U.S. PATENT DOCUMENTS

2003/0098085 A1   5/2003   Ito et al.
2003/0162029 A1   8/2003   Oki et al.

FOREIGN PATENT DOCUMENTS

EP     2 075 646 A1    7/2009
JP     61-149226       7/1986
(Continued)

OTHER PUBLICATIONS

International Search Report, dated Oct. 27, 2015 (Oct. 27, 2015).
European Search Report dated Feb. 23, 2018, 7 pages.

*Primary Examiner* — Ellen S Wood
(74) *Attorney, Agent, or Firm* — Rankin, Hill & Clark LLP (57) ABSTRACT

Provided is a fluororesin tube having excellent properties such as heat resistance, weather resistance, chemical resistance, peeling properties, and low dielectric properties that are specific to a fluororesin and also having an inner surface that has high adhesiveness with respect to different materials, particularly, silicone rubber.
A fluororesin tube is provided, in which an inner surface of the tube is subjected to plasma treatment by introducing vinylalkoxysilane into a plasma excitation gas, and an arithmetic average roughness Ra and an average length RSm of a roughness curve element with respect to the inner surface of the tube which is subjected to the plasma treatment satisfy Ra<0.08 μm and RSm<25 μm.

6 Claims, 3 Drawing Sheets

(51) Int. Cl.
    *C23C 16/04*    (2006.01)
    *C23C 16/513*   (2006.01)
    *B32B 1/08*     (2006.01)
    *B32B 25/20*    (2006.01)
    *C08J 7/12*     (2006.01)

(52) U.S. Cl.
    CPC .......... *C23C 16/045* (2013.01); *C23C 16/513* (2013.01); *B32B 2597/00* (2013.01); *C08J 2300/102* (2013.01)

(58) Field of Classification Search
    USPC .................................. 428/34.1, 36.92, 35.7
    See application file for complete search history.

(56) References Cited

FOREIGN PATENT DOCUMENTS

| | | |
|---|---|---|
| JP | 3-164246 | 7/1991 |
| JP | 10-030761 | 2/1998 |
| JP | 2003-130258 | 5/2003 |
| JP | 2003-313336 | 11/2003 |
| JP | 2011-148968 | 8/2011 |
| JP | 2012-233038 | 11/2012 |
| WO | 98/44026 | 10/1998 |

FIG. 6

FLUORORESIN TUBE

TECHNICAL FIELD

The present invention relates to a fluororesin tube having excellent properties such as heat resistance, weather resistance, chemical resistance, peeling properties, and low dielectric properties that are specific to a fluororesin and also having an inner surface that has high adhesiveness with respect to different materials, particularly, addition type silicone rubber having a SiH group and rubber having a functional group such as a hydroxyl group or a carboxyl group.

BACKGROUND ART

A fluororesin has excellent properties such as heat resistance, weather resistance, chemical resistance, peeling properties, and low dielectric properties. The fluororesin is not only formed into a molded body but is also used as a coating material. Thus, layer with different materials has been investigated. However, the surface energy of the fluororesin is small, and the bonding of the fluororesin and different materials is difficult.

An investigation on the stacking of a composite structure in which an organopolysiloxane cured layer is formed on the surface of a fluorine-based polymer by introducing a silane gas into a vacuum plasma generator and performing vacuum plasma treatment on the fluorine-based polymer, and different materials is conducted (for example, refer to Patent Document 1). However, in order to obtain satisfactory bonding of the composite structure and different materials, a primer is required.

On the other hand, in the above-described method, an object to be treated having a size that can be accommodated in the plasma generator is treated batchwise. In contrast, a method of continuously performing plasma treatment on a long molded product has been investigated. For example, an alkoxysilane compound is applied to the inner surface of a plastic tube and the inner surface is subjected to plasma treatment by atmospheric pressure glow discharge in helium or a mixed gas atmosphere of helium and argon to form a thin film of silica. A plastic tube in which additives are not eluted from the inner surface of the tube has been investigated but the effect of bonding has not been investigated. Thus, it is considered that sufficient adhesiveness cannot be obtained in this method (for example, refer to Patent Document 2).

CITATION LIST

Patent Documents

Patent Document: JP-A-3-164246
Patent Document: JP-A-2003-313336

SUMMARY OF INVENTION

Problems to be Solved by Invention

In recent years, there has been a demand for a fluororesin tube having excellent properties such as heat resistance, weather resistance, chemical resistance, peeling properties, and low dielectric properties that are specific to a fluororesin and also having an inner surface that has high adhesiveness with respect to different materials, particularly, addition type silicone rubber having a SiH group and rubber having a functional group such as a hydroxyl group or a carboxyl group, but such a fluororesin tube has not been realized.

An object of the present invention is to provide a fluororesin tube having excellent properties such as heat resistance, weather resistance, chemical resistance, peeling properties, and low dielectric properties that are specific to a fluororesin and also having an inner surface that has high adhesiveness with respect to different materials, particularly, addition type silicone rubber having a SiH group and rubber having a functional group such as a hydroxyl group or a carboxyl group. Another object of the present invention is to provide a stacking product in which the fluororesin tube is used as a surface member.

Means for Solving the Problems

As a result of intensive investigations to solve the above problems, the inventors of the present invention have found that a fluororesin tube, which can be obtained by subjecting the inner surface of the tube to plasma treatment by mixing vinylalkoxysilane in a plasma excitation gas by using a method of atmospheric-pressure surface discharge plasma treatment, in which an arithmetic average roughness Ra and an average length RSm of a roughness curve element with respect to the inner surface of the tube are less than specific values, has the above properties and have completed the present invention.

A fluororesin tube according to the present invention is a fluororesin tube, in which an inner surface of the tube is subjected to plasma treatment by introducing vinylalkoxysilane into a plasma excitation gas, and in which a an arithmetic average roughness Ra and an average length RSm of a roughness curve element with respect to the inner surface of the tube which is subjected to the plasma treatment satisfy $Ra<0.08$ μm and $RSm<25$ μm.

A fluororesin tube according to the present invention is a fluororesin tube, in which an inner surface of the tube is subjected to plasma treatment by introducing vinylalkoxysilane into a plasma excitation gas, and in which an arithmetic average roughness Ra and an average length RSm of a roughness curve element with respect to the inner surface of the tube which is subjected to the plasma treatment satisfy $Ra<0.08$ μm and $RSm<15$ μm.

Ra and RSm comply with JIS B 0601-2001.

A stacking product according to the present invention includes the above fluororesin tube as a surface member. A stacking product according to the present invention is preferably a fixing member.

Advantageous Effects of Invention

The fluororesin tube of the present invention has excellent properties such as heat resistance, weather resistance, chemical resistance, peeling properties, and low dielectric properties that are specific to a fluororesin and also having an inner surface that has high adhesiveness with respect to different materials, particularly, addition type silicone rubber having a SiH group and rubber having a functional group such as a hydroxyl group or a carboxyl group.

EMBODIMENTS FOR CARRYING OUT THE INVENTION

Figure 1:
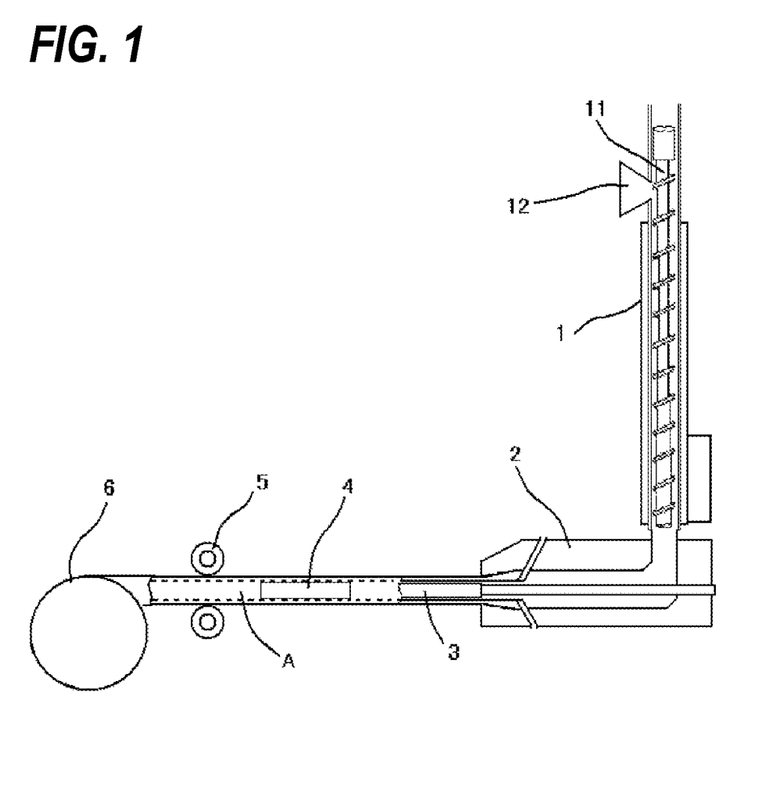
FIG. 1 is a schematic view showing one embodiment of an apparatus for producing a fluororesin tube of the present invention.

FIG. 1 is a schematic view showing one embodiment of an apparatus for producing a fluororesin tube of the present invention. The production apparatus is the same as a conventionally known resin tube extrusion molding apparatus and includes an extruder 1 which melts a fluororesin charged from a hopper 12 and extrudes the fluororesin by rotation of a screw 11, a metal mold (die) 2 attached to a tip end of the extruder 1, and an inner diameter regulating member 3 which is contacted with an inner surface of a fluororesin tube A extruded from the die 2 to the outside to cool the fluororesin tube, and a take-off machine 5 which takes off the fluororesin tube A cooled and solidified by the inner diameter regulating member 3 at a predetermined rate. The production apparatus further includes a discharge electrode 4 to be disposed in the inside of the fluororesin tube A extruded from the die 2 for subjecting the inner surface of the fluororesin tube A to plasma treatment, and a gas introduction mechanism for introducing a gas into a gap between the fluororesin tube A and the discharge electrode 4, and the pressure in the gap between the fluororesin tube A and the discharge electrode 4 is maintained at a constant level.

Figure 2:
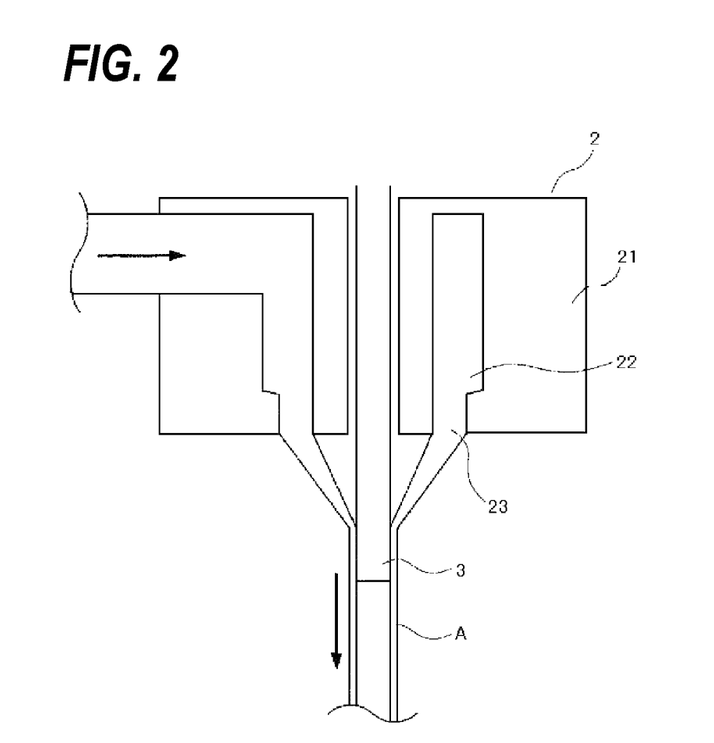
FIG. 2 is a cross-sectional view showing one embodiment of a die and an inner diameter regulating member.

FIG. 2 is a cross-sectional view showing one embodiment of the die 2 attached to the tip end of the extruder 1 and the inner diameter regulating member 3. The arrows in the drawing indicate a flow of the molten fluororesin and an extrusion direction of the tube. As shown in FIG. 2, a flow path 22 through which the molten fluororesin extruded from the extruder 1 passes, and an annular outlet hole 23 for forming the molten fluororesin into a tube shape are formed in a main body 21 of the die 2. The inner diameter regulating member 3 is formed in an annular shape in the main body 21. The inner diameter regulating member is provided so as to pass through the center portion of the outlet hole 23 to protrude from the die 2. The inner diameter regulating member 3 shown in FIG. 2 is formed into a cylindrical shape but the shape of the inner diameter regulating member 3 is a shape in which the shape of the cross section of a portion contacted with the inner surface of the tube is circular, such as a cone or a conical shape in which upper and lower surfaces of a cone (a bottom surface and a surface opposite to the bottom surface) are flattened. The outer diameter of the inner diameter regulating member 3 is determined according to the inner diameter of the fluororesin tube A. The molten fluororesin extruded from the extruder 1 on the left side in FIG. 2 is extruded from the outlet hole 23 of the die 2 and is contact with the outer peripheral surface of the inner diameter regulating member 3 to be cooled and solidified while being taken off at a constant rate.

Figure 3:
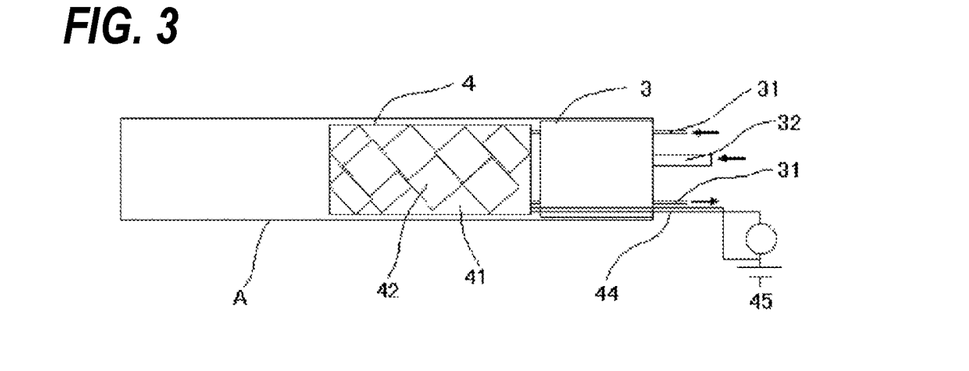
FIG. 3 is a side view showing one embodiment of a discharge electrode.

FIG. 3 is a side view showing one embodiment of a discharge electrode 4 to be disposed in the inside of the fluororesin tube A. The discharge electrode 4 is disposed at the tip of the inner diameter regulating member 3. The gap between the fluororesin tube A and the discharge electrode 4 is determined according to the conditions such as the shape of the discharge electrode 4, the voltage to be applied to the electrode, and the like, and is not limited to a particular range. The gap is preferably 0.1 to 8 mm, particularly preferably 0.1 to 5 mm, and more preferably 0.1 to 2.5 mm. The smaller the gap is, the higher the plasma density is, and thus the larger the gap is, the lower the plasma density is. A cooling medium flow path 31 through which a medium for cooling the inner diameter regulating member 3 and the discharge electrode 4 flows, a gas introduction path 32 which introduces a gas into the fluororesin tube A, and a metal wire 44 which is connected to a power supply 45 connected to the discharge electrode 4 are provided in the inner diameter regulating member 3.

FIG. 1 shows a production apparatus in which the fluororesin tube of the present invention is extrusion-molded from the extrusion molding apparatus and at the same time, the inner surface of the fluororesin tube A is subjected to plasma treatment. However, after extrusion molding is performed, the discharge electrode 4 can disposed on the inner surface of the fluororesin tube A to treat the inner surface of the tube in another step.

Figure 4A:
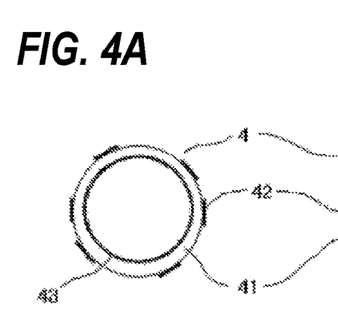
FIGS. 4A and 4B are schematic views showing one embodiment of the discharge electrode.
Figure 4B:
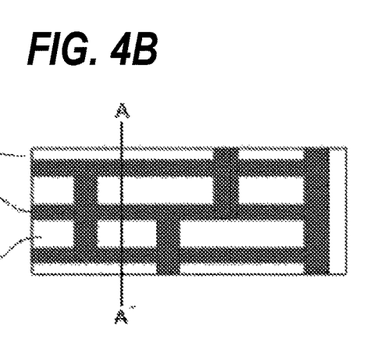

FIGS. 4A and 4B are schematic views showing one embodiment of the discharge electrode 4. FIG. 4B is a side view of the discharge electrode 4 and FIG. 4A is a cross-sectional view of FIG. 4B taken along A-A'. A conductor 43 is disposed on the inner surface of a cylindrical dielectric 41 and a conductor 42 in which a pattern shape is formed in the conductive portion is disposed on the outer surface of the dielectric 41. FIGS. 4A and 4B show the discharge electrode 4 having a mesh-shaped pattern. However, the pattern shape may employ various shapes such as a rod shape, and a spiral shape. The cylindrical dielectric 41 is not limited to the cylindrical shape and the shape of the cross section may be a cylindrical shape according to the shape of cross section of the fluororesin tube such an elliptic shape, a triangular shape, and a rectangular shape. The material constituting the dielectric 41 is a material excellent in heat resistance and dielectric properties, such as ceramics such as alumina or boron nitride, glass or quartz. In addition, a resin excellent in heat resistance and dielectric properties, such as a fluororesin, can be also used for the dielectric 41. The material constituting the conductors 42 and 43 is a conductive material such as copper, silver, gold, platinum, palladium, tungsten, nickel, aluminum, or carbon. The voltage is applied to the conductor 42 on the outer surface of the dielectric 41 and the ground is achieved on the side close to the conductor 43 on the inner surface of the dielectric 41. The structure in which the inner and outer surfaces of the cylindrical dielectric 41 are interposed between the conductors 42 and 43 makes arbitrary adjustment of the thickness of the dielectric 41 possible and widens the adjustment range of the conditions for plasma treatment by atmospheric pressure surface discharge.

The discharge voltage in the production of the fluororesin tube of the present invention is not limited to a particular range as long as the temperature at which the fluororesin tube of the present invention is not deformed is maintained. The voltage is preferably 5 to 15 kV.

The frequency in the production of the fluororesin tube of the present invention is not limited to a particular range as long as the conductors 42 and 43 are not damaged. The frequency is preferably 5 to 50 kHz.

The output in the production of the fluororesin tube of the present invention is determined according to the pattern of the conductor 42, the frequency, and the discharge voltage, and is not limited to a predetermined range. The output is preferably 10 to 1,000 W.

Hereinafter, the reaction assumed to be caused by the plasma treatment of the inner surface of the fluororesin tube will be described.

When a mixed gas of a plasma excitation gas that is easily changed into a plasma state and vinylalkoxysilane is supplied to the gap between the fluororesin tube A and the discharge electrode 4 from the gas introduction path 32 and the voltage is applied to the discharge electrode 4 from the power supply 45, plasma is generated from the discharge electrode 4 along the surface of the dielectric 41. By applying a high voltage, electric flux lines reach a distant place from the electrode surface, and the number of electric flux lines in the space of the gap between the fluororesin tube A and the discharge electrode 4 are increased so that the plasma density becomes higher. Under reduced pressure as in conventional vacuum plasma treatment, the excitation gas density is low and the plasma density becomes low. By applying a high voltage under atmospheric pressure as in the present invention, active species such as ions, radicals, and electrons derived from the excitation gas are present at a high density in the plasma. Even under the same atmospheric pressure, in the case in which the voltage to be applied is low as in conventional atmospheric pressure glow discharge treatment, the plasma density is low. The plasma is contacted with the inner surface of the fluororesin tube A and radicals are formed in the resin constituting the fluororesin tube A. The radicals of the fluororesin and the vinyl group of vinylalkoxysilane undergo a radical reaction and the vinylalkoxysilane is graft-polymerized with the fluororesin. The alkoxy group derived from the graft polymerization of the vinylalkoxysilane in the branch portion for forming a protrusion inside the fluororesin tube A is hydrolyzed by water in the air and turned into a hydroxyl group. The hydroxyl group is considered to contribute to an improvement in the adhesiveness with respect to different materials of the inner surface of the fluororesin tube of the present invention, particularly, silicone rubber having a SiH group and rubber having a functional group such as a hydroxyl group or a carboxyl group (the hydroxyl group, the SiH group of the surface of the silicone rubber, the functional group of the surface of the rubber such as a hydroxyl group or a carboxyl group undergo a condensation reaction). In the fluororesin tube not having sufficient adhesiveness with respect with different materials, a primer is used for improving adhesive strength or in a state in which rubber is not cured to reinforce adhesiveness. Since the inner surface of the fluororesin tube of the present invention has high adhesiveness, the inner surface is bonded to different materials without being subjected to plasma treatment and can be bonded to different materials while semi-curing the rubber. Thus, sufficient adhesiveness can be obtained.

In addition, on the inner surface of the fluororesin tube A, not only graft-polymerized vinylalkoxysilane but also vinylalkoxysilane which is not graft-polymerized and attached to the inner surface of the fluororesin tube A are present. The vinylalkoxysilane is hydrolyzed by water in the air and further undergoes a condensation reaction as time passes. The condensation reaction consumes the hydroxyl group in the branch portion that is considered to be formed on the inner surface of the fluororesin tube A. Which of the graft polymerization by a radical reaction and the condensation reaction by hydrolysis is caused to preferentially proceed varies depending on the conditions for plasma treatment and also varies depending on the type of alkoxy silane to be used and the like.

In the plasma treatment at the time of production of the fluororesin tube of the present invention, as the plasma density increases, the contact with the inner surface of the fluororesin tube A increases, and thus the amount of generated radicals of the fluororesin increases. The number of reaction points for radical reaction increases. Further, the reaction of the graft polymerization by the radical reaction occurs rapidly and a large number of small protrusions are formed on the inner surface of the fluororesin tube A at the initial stage of the radical reaction. Although the size of the protrusions formed at the initial stage of the reaction is increased by the graft polymerization, the protrusions are finely dispersed and thus the size for one protrusion is not increased to be larger than a predetermined size. On the other hand, in the conventional vacuum plasma treatment and the conventional atmospheric pressure glow discharge treatment (conventional plasma treatment), as described above, the plasma density is low, the amount of formed radicals of the fluororesin is small, and the number of reaction points for radical reaction is small. Thus, the ratio of the graft polymerization reaction is reduced. Since the number of protrusions formed on the inner surface of the fluororesin tube A at the initial stage of the reaction is small and a condensation reaction by hydrolysis frequently occurs without graft polymerization, the size of the protrusions formed on the inner surface of the fluororesin tube A is increased.

As described above, the size of the protrusions varies due to different reactions and by applying a high voltage under atmospheric pressure as in the present invention, vinylalkoxysilane is graft-polymerized and the size of the protrusions formed on the inner surface of the fluororesin tube is small so that the arithmetic average roughness Ra and the average length RSm of the roughness curve element are smaller than predetermined values. The arithmetic average roughness of the inner surface of the fluororesin tube of the present invention satisfies Ra<0.08 μm, similarly, the average length satisfies RSm<15 μm, and the fluororesin tube has a large number of hydroxyl groups effective in bonding with different materials. On the other hand, since a condensation reaction preferentially proceeds in the conventional plasma treatment, the size of protrusions formed on the inner surface of the fluororesin tube is large, arithmetic average roughness Ra of the inner surface of the fluororesin tube A and the average length RSm of the roughness curve element are increased. In the fluororesin tube in which Ra and RSm of the inner surface are too large, the hydroxyl group effective in bonding by a condensation reaction is consumed and thus adhesiveness with respect to different materials is small.

Specific examples of the plasma excitation gas include hydrogen; rare gases such as helium and argon; and nitrogen. One or two or more of excitation gases are used.

Preferably, a plurality of gas introduction paths 32 are provided and the concentration of a mixed gas becomes uniform. The introduction rate of the mixed gas of plasma excitation gas and vinylalkoxysilane is arbitrarily adjusted. The introduction rate of the excitation mixed gas is typically 0.1 to 10 L/min under the atmospheric pressure. The mixed gas may be introduced in a mixed state or each of the plasma excitation gas and vinylalkoxysilane may be separately introduced and then mixed.

The fluororesin tube A which is extruded from the extruder 1 and has the inner surface which has been subjected to plasma treatment is taken off by the take-off machine 5. The take-off machine 5 includes a pair of rolls disposed with a predetermined interval. The fluororesin tube A is taken off at a predetermined rate while being interposed between the rolls of the take-off machine 5. The take-off rate is appropriately adjusted.

Specific examples of the fluororesin constituting the fluororesin tube of the present invention include a tetrafluoroethylene/perfluoroalkyl vinyl ether copolymer (PFA), a tetrafluoroethylene/hexafluoropropylene copolymer (FEP), a tetrafluoroethylene/ethylene copolymer (ETFE), polyvinylidene fluoride (PVDF), polytetrafluoroethylene (PTFE), and a tetrafluoroethylene/hexafluoropropylene/vinylidene fluoride copolymer (THV). A preferable fluororesin is PFA.

The formation of the protrusions on the inner surface of the fluororesin tube, which has been subjected to plasma treatment through the above-described process, by the graft-polymerized vinylalkoxysilane can be confirmed by observation with a microscope and analysis using IR, XPS, EDX and the like. In addition, even after the fluororesin tube is contacted with different materials such as rubber, the protrusions formed on the inner surface of the fluororesin tube are maintained and the fluororesin tube which has been contacted with different materials is cut in a state in which the different materials are made to remain thinly. The different materials are peeled off by swelling the different materials with an organic solvent such as benzene or toluene or the different materials are decomposed by immersing the different materials in an acid or alkali solution to expose the surface of the fluororesin film, and the formation of the protrusions of the fluororesin tube can be confirmed in the same manner by observation and analysis.

EXAMPLES

Hereinafter, the present invention will be described in detail using examples but the present invention is not limited to these examples.

Ra and RSm of Inner Surface of Fluororesin Tube

Using a confocal microscope (OPTELICS H1200) manufactured by Lasertec Corporation, the surface shape of the inner surface of the tube was measured with a resolution of 0.01 µm in a height direction. The evaluation length of a location of 150 µm apart from an arbitrary position of the obtained surface shape in the longitudinal direction of the tube was measured and curvature correction was performed by a secondary function. Then, the surface roughness was measured based on JIS B 0601. The measurement of the surface roughness was performed such that the cut-off value when the cross section curve was created from the cross section curve of the actual surface was set to 0.0025 mm and the cut-off value when the roughness curve was created from the cross section curve was set to 0.08 mm.

Bonding Test of Inner Surface of Fluororesin Tube

The addition type silicone rubber semi-cured by heating was stacked on the inner surface of the fluororesin tube which has been cut and the stacking product was heated at 200° C. for 4 hours to confirm the bonding state. When the cut fluororesin tube was peeled off from the silicone rubber, a case in which cohesive breaking occurred was evaluated as good and a case in which peeling occurred at the interface thereof was evaluated as poor.

Presence of Si Contained in Inner Surface of Fluororesin Tube

Using an X-ray photoelectron spectrometry (ESCA-3400 manufactured by Shimadzu Corporation), the spectrum was measured under the conditions of an X-ray source of MgKα-ray at a voltage of 10 kV and a current of 20 mA, and peak separation was performed on the obtained spectrum. The peak area corresponding to a C atom and a Si atom was calculated and an atomic ratio of Si atom to C atom (Si/C) was obtained.

Examples 1 to 5 and Comparative Examples 1 to 5

The extruder 1 schematically shown in FIG. 1 was used and PFA (451HP-J manufactured by Du Pont-Mitsui Fluorochemicals Co., Ltd.) was used as a raw material to form a fluororesin tube. The diameter of the die 2 was 25 mm and the outer diameter of a portion of the inner diameter regulating member 3 which was contacted with the fluororesin tube was 24.5 mm. Six gas introduction and exhaust paths 32 were provided in the inner diameter regulating member 3. An aluminum sheet having a thickness of 80 µm was bonded to the inner surface of a cylindrical alumina ceramic pipe having an outer diameter of 22 mm and an inner diameter of 20 mm and a comb-shaped (with an interval between teeth of 6 mm and a thickness of a tooth of 3 mm) alumina sheet having a thickness of 80 µm was bonded to the outer surface of the alumina ceramic pipe. Thus, the discharge electrode 4 was prepared. The outer diameter of the discharge electrode 4 was set such that the distance between the outer surface of the discharge electrode 4 and the inner surface of the fluororesin tube was set as shown in Table 1. The length of the discharge electrode 4 was 15 cm. The voltage applied was 10 kV, the frequency was 18 kHz, and the amount of flowing mixed gas of the excitation gas and silane shown in Table 1 was 1 L/min. The silane was vaporized by bubbling and mixed with the excitation gas. The amount of flowing vaporized silane used in Example 3 was half of the amount of silane flowing in other Examples and Comparative Examples. The extrusion temperature was set to 390° C. and the take-off rate was set to 2 m/min (plasma treatment time: 10 seconds) to form a fluororesin tube having an outer diameter of 24.5 mm and a thickness of 30 µm.

Ra and RSm of the inner surface of the formed fluororesin tube, the adhesiveness with respect to silicone rubber, and the presence of Si contained in the inner surface of the fluororesin tube were measured as shown below. The results are shown in Table 1.

TABLE 1

| | Excitation gas | Electrode distance (mm) | Silane | Ra (µm) | RSm (µm) | Adhesiveness | Si/C |
|---|---|---|---|---|---|---|---|
| Comparative Example 1 | — | 2 | — | 0.009 | 5.433 | Poor | — |
| Comparative Example 2 | He | 2 | — | 0.009 | 6.898 | Poor | — |
| Comparative Example 3 | Ar | 2 | Methylltrimethoxysilane | 0.133 | 15.025 | Poor | 0.12 |

TABLE 1-continued

| | Excitation gas | Electrode distance (mm) | Silane | Ra (μm) | RSm (μm) | Adhesiveness | Si/C |
|---|---|---|---|---|---|---|---|
| Example 1 | Ar | 2 | Vinyltrimethoxysilane | 0.031 | 6.522 | Good | 0.26 |
| Example 2 | Ng | 2 | Vinyltrimethoxysilane | 0.058 | 5.882 | Good | 0.28 |
| Example 3 | Ar | 2 | Vinyltrimethoxysilane | 0.011 | 5.382 | Good | 0.32 |
| Comparative Example 4 | Ng | 3 | Vinyltrimethoxysilane | 0.097 | 21.901 | Poor | 0.18 |
| Example 4 | He | 1 | Vinyltrimethoxysilane | 0.014 | 8.125 | Good | 0.27 |
| Comparative Example 5 | He | 3 | Vinyltrimethoxysilane | 0.070 | 34.115 | Poor | 0.16 |
| Example 5 | Ng | 1 | Vinyltrimethoxysilane | 0.025 | 9.042 | Good | 0.29 |

Ra and RSm of the inner surface of the fluororesin tube of each of Examples 1 to 5 were small and the adhesiveness with respect to silicone rubber was good.

The Si atoms were not detected in the inner surface of the fluororesin tube of Comparative Example 1 obtained by performing treatment in the atmosphere not including a plasma excitation gas and vinylalkoxysilane, and the inner surface of the fluororesin tube of Comparative Example 2 obtained by performing plasma treatment in the atmosphere not including vinylalkoxysilane. Ra and RSm of the inner surface of each of these fluororesin tubes were small but the adhesiveness of inner surface of each of these fluororesin tubes with respect to silicone rubber was poor.

Ra of the inner surface of the fluororesin tube of Comparative Example 2 obtained by performing plasma treatment in the atmosphere including silane instead of vinylalkoxysilane was large and the adhesiveness with respect to silicone rubber was poor.

Ra of the inner surface of the fluororesin tube of Comparative Example 4 in which the plasma density was considered to be too low was large, similarly, RSm of the inner surface of the fluororesin tube of Comparative Example 5 was large, and the adhesiveness of these fluororesin tubes with respect to silicone rubber was poor.

A fluororesin tube was formed in Example 6 while setting the same conditions as the conditions in Examples 1 to 5 and Comparative Examples 1 to 5 except that the take-off rate was set to 3 m/min (plasma treatment time: 7 seconds).

Ra and RSm of the inner surface of the formed fluororesin tube, the adhesiveness with respect to silicone rubber, and the presence of Si contained in the inner surface of the fluororesin tube were measured as shown below. The results are shown in Table 2.

TABLE 2

| | Excitation gas | Electrode distance (mm) | Silane | Ra (μm) | RSm (μm) | Adhesiveness | Si/C |
|---|---|---|---|---|---|---|---|
| Example 6 | Ar | 2 | Vinyltrimethoxysilane | 0.022 | 22.624 | Almost good | 0.25 |

Ra and RSm of the inner surface of the fluororesin tube of Example 6 were small and the adhesiveness with respect to silicone rubber was almost good.

Figure 5:
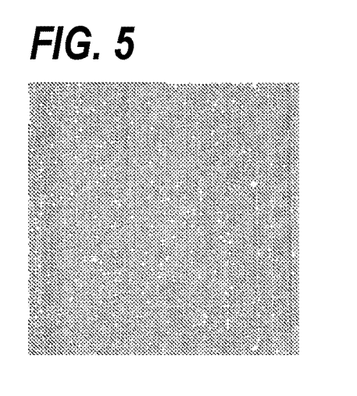
FIG. 5 is a micrograph figure of an inner surface of one embodiment of a fluororesin tube of the present invention.
Figure 6:
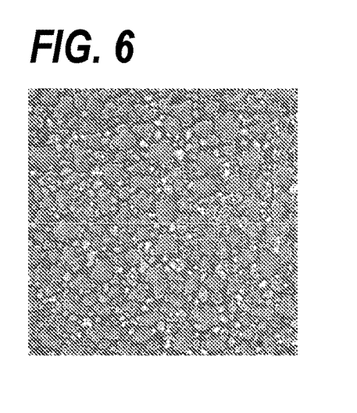
FIG. 6 is a micrograph figure of an inner surface of a fluororesin tube in which the amount of protrusion of the inner surface is too large.

FIG. 5 is a micrograph figure of the inner surface of the fluororesin tube of Example 3 and FIG. 6 is a micrograph figure of the inner surface of the fluororesin tube of Comparative Example 5. It was found that the protrusions of the inner surface of the fluororesin tube of Comparative Example 5 were larger than the protrusions of the inner surface of the fluororesin tube of Examples 3.

INDUSTRIAL APPLICABILITY

Since the adhesiveness of the inner surface of the fluororesin tube of the present invention which has been subjected to plasma treatment is excellent, the inner surface of the fluororesin tube can be bonded to semi-cured silicone rubber without using a primer, the outer surface thereof does not have scratches and creases, and the releasing properties are excellent, the fluororesin tube of the present invention is usefully used as a releasing layer for a surface of a roll, a belt, and the like in a printing machine, a printer, and a copy machine and particularly useful as a fixing roll and a fixing belt.

In addition, the fluororesin tube of the present invention can be used as a film by cutting. The film is useful as a releasing layer for a pressure-bonding sheet of a coverlay film or an anisotropic conductive film (ACF) by being stacked on a sliding surface which requires a low friction coefficient, such as an oil seal or a piston ring, and can be used for various applications requiring bonding with other materials.

REFERENCE SIGNS LIST

1 . . . Extruder
11 . . . Screw
12 . . . Hopper
2 . . . Metal mold (die)
21 . . . Metal mold main body
22 . . . Fluororesin flow path
23 . . . Outlet hole
3 . . . Inner diameter regulating member
31 . . . Cooling medium flow path
32 . . . Gas introduction path
4 . . . Discharge electrode
41 . . . Dielectric
42, 43 . . . Conductor
44 . . . Wire
45 . . . Power supply
5 . . . Take-off machine
A . . . Fluororesin tube

The invention claimed is:

1. A fluororesin tube comprising, an inner surface that is subjected to plasma treatment by introducing vinylalkoxysilane into a plasma excitation gas,
   wherein the inner surface subjected to the plasma treatment has an arithmetic average roughness Ra and an average length RSm of a roughness curve element which satisfy Ra<0.08 μm and RSm<25 μm.

2. A fluororesin tube comprising , an inner surface that is subjected to plasma treatment by introducing vinylalkoxysilane into a plasma excitation gas,
   wherein the inner surface subjected to the plasma treatment has an arithmetic average roughness Ra and an average length RSm of a roughness curve element which satisfy Ra<0.08 μm and RSm<15 μm.

3. A stacking product comprising the fluororesin tube according to claim 1 as a surface member thereof.

4. The stacking product according to claim 3, which is a fixing member.

5. A stacking product comprising the fluororesin tube according to claim 2 as a surface member thereof.

6. The stacking product according to claim 5, which is a fixing member.

\* \* \* \* \*